(12) United States Patent
Kim

(10) Patent No.: US 11,282,795 B2
(45) Date of Patent: Mar. 22, 2022

(54) SEMICONDUCTOR PACKAGE WITH BARRIER LAYER

(71) Applicant: Samsung Electronics Co., Ltd., Suwon-si (KR)

(72) Inventor: Sanguk Kim, Cheonan-si (KR)

(73) Assignee: Samsung Electronics Co., Ltd.

( * ) Notice: Subject to any disclaimer, the term of this patent is extended or adjusted under 35 U.S.C. 154(b) by 63 days.

(21) Appl. No.: 16/929,956

(22) Filed: Jul. 15, 2020

(65) Prior Publication Data

US 2021/0225772 A1 Jul. 22, 2021

(30) Foreign Application Priority Data

Jan. 20, 2020 (KR) ........................ 10-2020-0007407

(51) Int. Cl.
 *H01L 23/495* (2006.01)
 *H01L 23/538* (2006.01)
 (Continued)

(52) U.S. Cl.
 CPC ...... *H01L 23/5389* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5386* (2013.01); *H01L 24/16* (2013.01); *H01L 24/19* (2013.01); *H01L 24/20* (2013.01); *H01L 25/105* (2013.01); *H01L 2224/16265* (2013.01); *H01L 2224/214* (2013.01); *H01L 2225/1035* (2013.01); *H01L 2225/1052* (2013.01); *H01L 2225/1058* (2013.01)

(58) Field of Classification Search
 CPC ............. H01L 23/3128; H01L 23/5383; H01L 23/5386; H01L 23/5389; H01L 24/16; H01L 24/20; H01L 2224/16265; H01L 2224/214
 USPC ........................................................ 257/668
 See application file for complete search history.

(56) References Cited

U.S. PATENT DOCUMENTS

| | | |
|---|---|---|
| 8,367,470 B2 | 2/2013 | Pagaila |
| 9,666,559 B2 | 5/2017 | Wang et al. |

(Continued)

FOREIGN PATENT DOCUMENTS

| | | |
|---|---|---|
| KR | 10-1454090 B1 | 10/2014 |
| KR | 10-1771064 B1 | 8/2017 |
| KR | 10-1859340 B1 | 5/2018 |

*Primary Examiner* — Luan C Thai
(74) *Attorney, Agent, or Firm* — Myers Bigel, P.A.

(57) ABSTRACT

A packaged integrated circuit device includes a frame having a cavity therein and an inner semiconductor chip within the cavity. A lower re-distribution layer is provided, which extends adjacent lower surfaces of the frame and the inner semiconductor chip. The lower re-distribution layer has an opening therein which at least partially exposes the lower surface of the inner semiconductor chip. A lower semiconductor chip is provided, which extends adjacent the lower surface of the inner semiconductor chip, and within the opening in the lower re-distribution layer. This lower re-distribution layer includes: (i) an insulating layer covering the lower surface of the frame, (ii) a re-distribution pattern disposed on the insulating layer, and (iii) a barrier layer, which is disposed on the insulating layer and surrounds at least a portion of the lower semiconductor chip.

20 Claims, 18 Drawing Sheets

(51) Int. Cl.
*H01L 23/00* (2006.01)
*H01L 25/10* (2006.01)
*H01L 21/48* (2006.01)
*H01L 21/56* (2006.01)
*H01L 23/31* (2006.01)

(56) References Cited

U.S. PATENT DOCUMENTS

| | | |
|---|---|---|
| 9,711,488 B2 * | 7/2017 | Lin .................. H01L 24/19 |
| 9,881,894 B2 | 1/2018 | Pendse |
| 10,141,201 B2 | 11/2018 | Yu et al. |
| 10,199,321 B2 * | 2/2019 | Lin .................. H01L 23/3121 |
| 2011/0161748 A1 | 6/2011 | Casper et al. |
| 2012/0284436 A1 | 11/2012 | Casper et al. |
| 2015/0161005 A1 | 6/2015 | Casper et al. |
| 2016/0200566 A1 | 7/2016 | Ofner et al. |
| 2017/0217766 A1 | 8/2017 | Ofner et al. |
| 2018/0186627 A1 | 7/2018 | Ofner et al. |
| 2018/0232275 A1 | 8/2018 | Casper et al. |
| 2019/0148330 A1 | 5/2019 | Chen et al. |
| 2019/0354437 A1 | 11/2019 | Casper et al. |

* cited by examiner

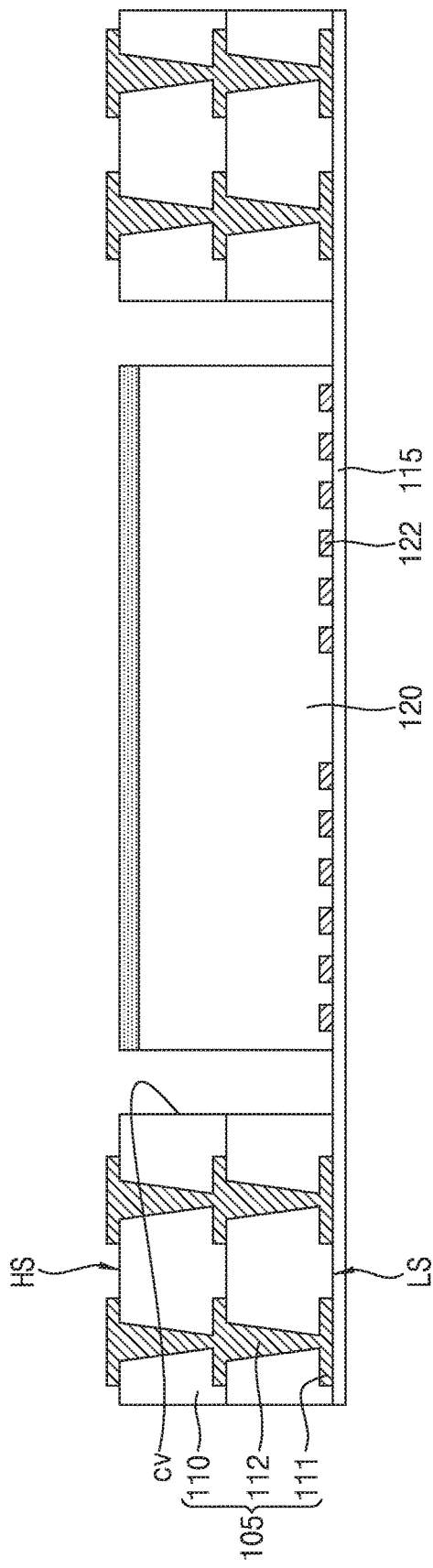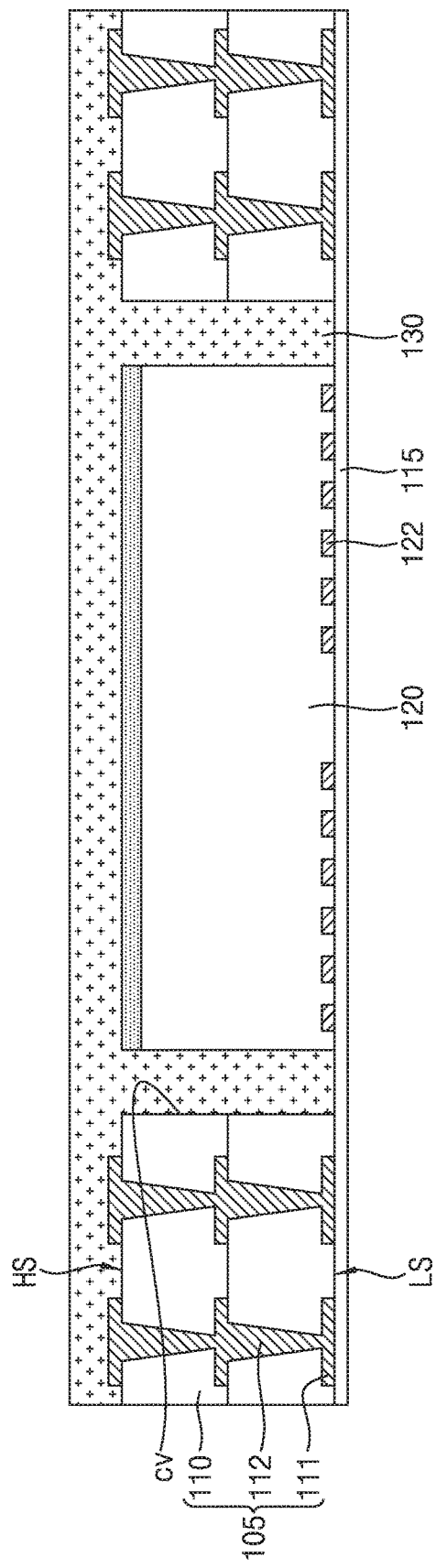

SEMICONDUCTOR PACKAGE WITH BARRIER LAYER

REFERENCE TO PRIORITY APPLICATION

This application claims priority from Korean Patent Application No. 10-2020-0007407, filed Jan. 20, 2020, the disclosure of which is hereby incorporated herein by reference in its entirety.

BACKGROUND

1. Field

Exemplary embodiments of the disclosure relate to semiconductor packages configured to support thermal damage to semiconductor chips therein, and methods of fabricating the same.

2. Description of the Related Art

In accordance with miniaturization and lightness of semiconductor chips, research is being conducted into multi-chip packages, which are capable of achieving high speed/broadband input/output (I/O) transmission. As an electronic circuit including semiconductor chips or semiconductor chip packages is realized using stacking technology, improvement in integration degree and signal transmission characteristics may be achieved.

For realization of such an electronic circuit, it is necessary to appropriately utilize passive elements such as capacitors or DRAM boosting memories with semiconductor chips. Conventionally, a structure in which passive elements are mounted on a bottom surface of a package can be mass produced. But, there may be drawbacks in that power transmission characteristics may be degraded in accordance with an increase in the length of an interconnect between a semiconductor chip and a passive element. Furthermore, mounting of a passive element may cause the resultant semiconductor package to be increased in total height. For this reason, there may be a drawback in that the above-mentioned structure is difficult to apply to electronic products having an increasing tendency toward miniaturization. Therefore, it is necessary to develop semiconductor packages that support 3-dimensional integrated circuits while miniaturizing the length of an interconnect between a semiconductor chip and a passive element (e.g., capacitor).

SUMMARY

The exemplary embodiments of the disclosure provide a semiconductor package in which a re-distribution layer is opened to enable a passive element to be directly mounted on a semiconductor chip while preventing thermal damage to the semiconductor chip in a process of opening the re-distribution layer, and a manufacturing method thereof.

A packaged semiconductor device according to an embodiment of the disclosure includes a frame having a cavity therein. An inner semiconductor chip is provided, which is disposed within the frame. A lower re-distribution layer is provided, which is disposed on lower surfaces of the frame and the inner semiconductor chip. And, a lower semiconductor chip is provided, which is disposed on the lower surface of the inner semiconductor chip. In some embodiments, the lower re-distribution layer includes an opening for partially exposing the lower surface of the inner semiconductor chip, wherein the lower semiconductor chip is disposed within the opening, wherein the lower re-distribution layer includes: an insulating layer covering the lower surface of the frame, a re-distribution pattern disposed on the insulating layer, and a barrier layer disposed on the insulating layer, and wherein the barrier layer surrounds the lower semiconductor chip when viewed from a top plan view perspective.

A semiconductor package according to another embodiment of the disclosure includes a frame having a cavity therein. An inner semiconductor chip is provided, which is disposed within the frame. A lower re-distribution layer is provided, which is disposed on lower surfaces of the frame and the inner semiconductor chip. And, a lower semiconductor chip is provided, which is disposed on the lower surface of the inner semiconductor chip. The lower re-distribution layer includes a first insulating layer covering the lower surface of the inner semiconductor chip, a re-distribution pattern disposed on the first insulating layer, a barrier layer disposed on the first insulating layer, and a second insulating layer disposed on the barrier layer while partially exposing an upper surface of the barrier layer. The first insulating layer, the re-distribution pattern, the barrier layer and the second insulating layer of the lower re-distribution layer have a stepped structure.

A semiconductor package according to another embodiment of the disclosure includes a frame including a cavity, an inner semiconductor chip disposed within the frame, a lower re-distribution layer disposed on lower surfaces of the frame and the inner semiconductor chip, and a lower semiconductor chip disposed on the lower surface of the inner semiconductor chip. According to some embodiments, the lower re-distribution layer includes an opening for partially exposing the lower surface of the inner semiconductor chip. The lower semiconductor chip is disposed within the opening, and the lower re-distribution layer includes a first insulating layer covering the lower surface of the frame. A re-distribution pattern is disposed on the first insulating layer, a barrier layer is disposed on the first insulating layer, and a second insulating layer is disposed on the barrier layer. The lower semiconductor chip includes a body disposed on the lower surface of the inner semiconductor chip. A solder ball electrically connects the body and the inner semiconductor chip. A mold layer is interposed between the body and the lower re-distribution layer. The barrier layer surrounds the lower semiconductor chip when viewed in a top view, and a portion of an upper surface of the barrier layer contacts the mold layer.

BRIEF DESCRIPTION OF THE DRAWINGS

FIGS. 6 to 20 are cross-sectional views explaining a semiconductor package manufacturing method according to an exemplary embodiment of the disclosure.

DETAILED DESCRIPTION OF EXEMPLARY EMBODIMENTS

Figure 1:
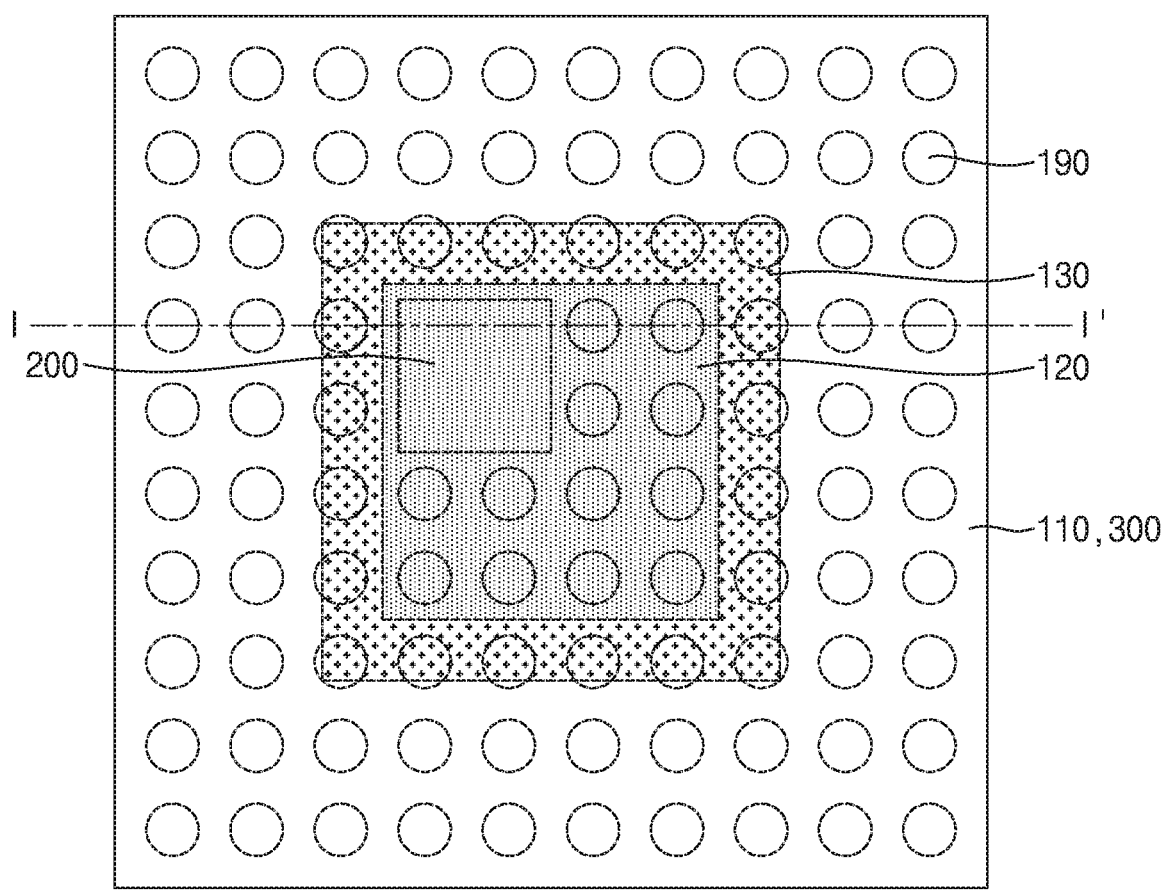
FIG. 1 is a schematic top view of a semiconductor package 10 according to an exemplary embodiment of the disclosure.
Figure 2:
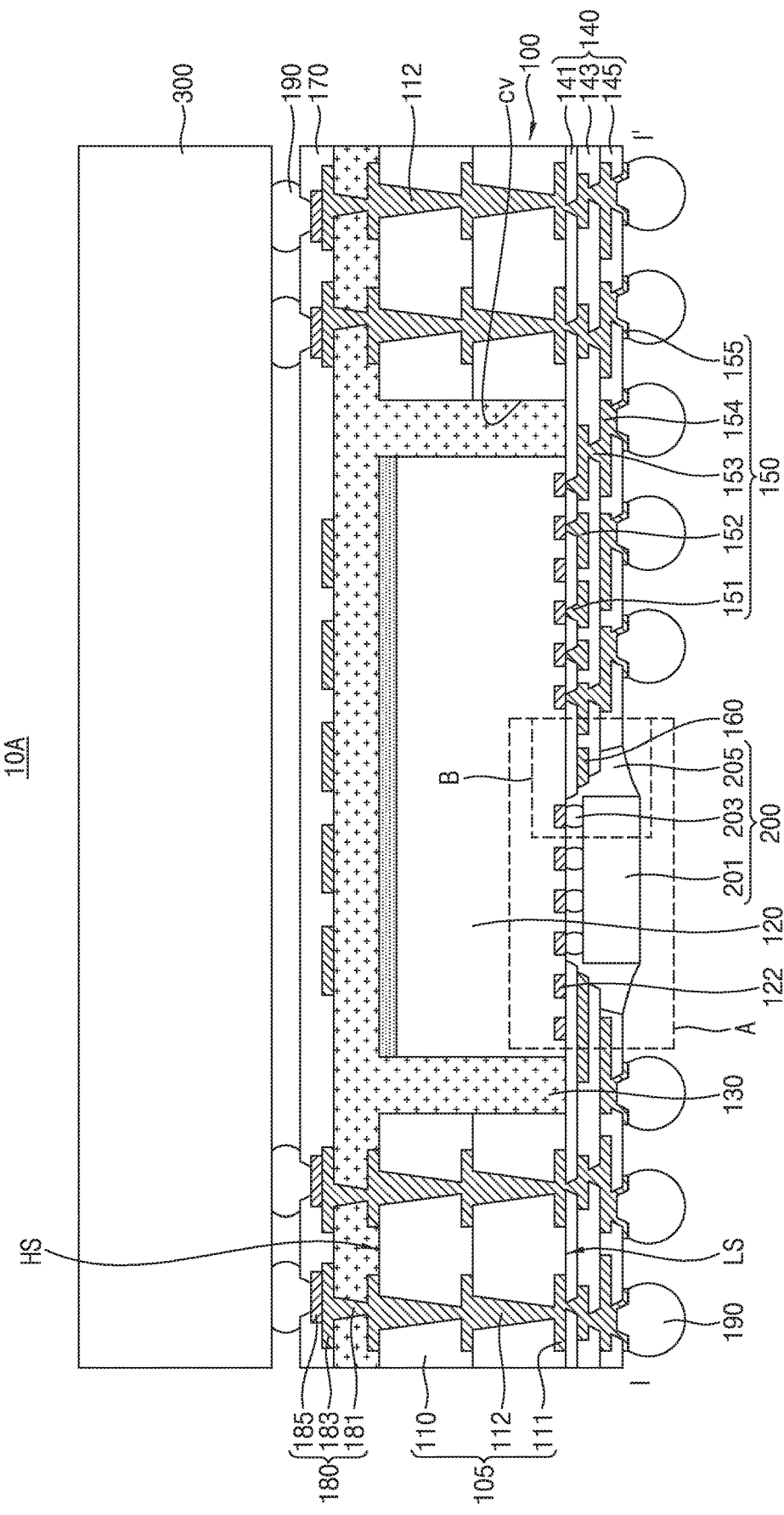
FIG. 2 is a cross-sectional view of a semiconductor package 10A according to an exemplary embodiment of the disclosure taken along line I-I' in FIG. 1.

FIG. 1 is a schematic top view of a semiconductor package 10 according to an exemplary embodiment of the disclosure. FIG. 2 is a cross-sectional view of a semiconductor package 10A according to an exemplary embodiment of the disclosure taken along line I-I' in FIG. 1.

Referring to FIGS. 1 and 2, the semiconductor package 10A may include a lower semiconductor package 100 and an upper semiconductor package 300. The semiconductor package 10 may be, for example, a semiconductor package having a package-on-package (PoP) structure in which the upper semiconductor package 300 is mounted on the lower semiconductor package 100. The lower semiconductor package 100 may be, for example, a semiconductor package having a fan-out-panel-level package (FOPLP) structure. The lower semiconductor package 100 may include a frame 105, an inner semiconductor chip 120, an encapsulator 130, a lower re-distribution layer 140/150/160, a lower semiconductor chip 200, an upper re-distribution layer 170/180, and connecting terminals 190. The frame 105 may include a core 110, connecting pads 111, and through-silicon-vias (TSVs) 112. For example, the frame 105 may be a printed circuit board.

The core 110 has a cavity CV at a central portion thereof. The core 110 may be a plate having a quadrangular rim shape when viewed in a top view. A plurality of cores 110 may be stacked. For example, the core 110 may be made of at least one material of phenol resin, epoxy resin, or polyimide. For example, the core 110 may include at least one material of flame retardant 4 (FR4), tetrafunctional epoxy, polyphenylene ether, bismaleimide triazine (BT), epoxy/polyphenylene oxide, Thermount, cyanate ester, polyimide, or liquid crystal polymer.

The connecting pads 111 may be disposed at upper and lower surfaces HS and LS of the core 110. Each TSV 112 may extend through the core 110 to electrically connect corresponding ones of the connecting pads 111 disposed at the upper surface HS of the core 110 and the connecting pads 111 disposed at the lower surface LS of the core 110. For example, each connecting pad 111 may include at least one of an electrolytically-deposited (ED) copper foil, a rolled-annealed (RA) copper foil, a stainless steel foil, an aluminum foil, an ultra-thin copper foil, sputtered copper, or a copper alloy. TSV 112 may include at least one of copper, nickel, stainless steel, or beryllium copper.

The inner semiconductor chip 120 may be disposed within the cavity CV of the core 110. The cavity CV may have a greater horizontal cross-sectional area than the inner semiconductor chip 120. The inner semiconductor chip 120 may be disposed to be spaced apart from an inner side surface of the core 110 within the cavity CV of the core 110.

Chip pads 122 may be disposed at a lower portion of the inner semiconductor chip 120. Lower surfaces of the chip pads 122 may be co-planar with a lower surface of the inner semiconductor chip 120. The lower surfaces of the chip pads 122 may be co-planar with lower surfaces of the connecting pads 111 disposed at the lower surface LS of the core 110. In an exemplary embodiment, each chip pad 122 may be disposed on the lower surface of the inner semiconductor chip 120 while having a structure protruding from the lower surface of the inner semiconductor chip 120.

For example, the inner semiconductor chip 120 may be a central processor unit (CPU), a microprocessor unit (MPU), a graphics processor unit (GPU), or an application processor (AP) unit. In an exemplary embodiment, the inner semiconductor chip 120 may be a controller semiconductor chip configured to control the upper semiconductor package 300 which will be described later.

The encapsulator 130 may be disposed within the cavity CV of the core 110. The encapsulator 130 may completely fill a space between the inner side surface of the core 110 and a side surface of the inner semiconductor chip 120, and may contact the lower re-distribution layer 140/150/160 and the upper re-distribution layer 170/180. The lower re-distribution layer 140/150/160 may be disposed on a lower surface of the frame 105. The upper re-distribution layer 170/180 may be disposed on an upper surface of the frame 105.

The re-distribution layer 140/150/160 may include an insulating layer 140 and a re-distribution pattern 150. A plurality of insulating layers 140 may be stacked on the lower surface of the frame 105. For example, the insulating layer 140 may include first to third insulating layers 141, 143 and 145 sequentially stacked on the lower surface of the frame 105. The first insulating layer 141 may cover the lower surface of the frame 105. The third insulating layer 145 may form a bottom surface of the lower semiconductor package 100. The second insulating layer 143 may be disposed between the first insulating layer 141 and the third insulating layer 145.

At least one of the plurality of insulating layers 140 may be made of a material different from those of the remaining insulating layers 140. For example, the first insulating layer 141 and the second insulating layer 143 may be made of photo imageable dielectric (PID), and the third insulating layer 145 may be an ajinomoto build-up film (ABF). (See, e.g., https://www.ajinomoto.com/innovation/action/buildup-film). In an exemplary embodiment, the first insulating layer 141 and the second insulating layer 143 may include epoxy or polyimide.

A plurality of re-distribution patterns 150 may be disposed on the lower surface of the frame 105 in the form of a multilayer structure. The re-distribution pattern 150 may include vias 151 and 153, and wiring layers 152 and 154. The re-distribution pattern 150 may include under-bump-metallurgy (UBM) pads 155. For example, the re-distribution pattern 150 may include copper, nickel, stainless steel, or a copper alloy such as beryllium copper.

The lower semiconductor chip 200 may be disposed on the lower surface of the inner semiconductor chip 120. The lower semiconductor chip 200 may be bonded to the inner semiconductor chip 120 using a flip-chip bonding process. The lower semiconductor chip 200 may include a body 201, solder balls 203, and a mold layer 205.

The solder balls 203 may be disposed on some of the chip pads 122 of the inner semiconductor chip 120, respectively. The body 201 may be disposed on the solder balls 203 at the lower surface of the inner semiconductor chip 120. The solder balls 203 may electrically connect the body 201 and the inner semiconductor chip 120. The mold layer 205 may cover side and lower surfaces of the body 201 while covering the solder balls 203 and an exposed surface of the inner semiconductor chip 120. The mold layer 205 may be interposed between the body 201 and the lower re-distribution layer 140/150/160.

The upper re-distribution layer 170/180 may be disposed on the upper surface of the frame 105. The upper re-distribution layer 170/180 may include an insulating layer 170 and a re-distribution pattern 180. The insulating layer 170 may include an ABF and a solder resist layer. The re-distribution pattern 180 may include vias 181 and a wiring layer 183. The re-distribution pattern 180 may include connecting pads 185. Each via 181 may extend through the encapsulator 130, which covers the upper surface HS of the core 110, and, as such, may connect a corresponding one of the connecting pads 111 and a corresponding portion of the wiring layer 183. The wiring layer 183 may be disposed on the encapsulator 130. The connecting pads 185 may be disposed on some of the wiring layer 183, respectively. The vias 191 and the wiring layer 183 may include copper in some embodiments of the invention. The connecting pads 185 may include nickel and/or aluminum in some embodiments of the invention. The upper re-distribution layer 170/180 may include the same material as the lower re-distribution layer 140/150/160 in some embodiments of the invention, but is not limited thereto.

The connecting thermals 190 may be disposed on the lower re-distribution layer 140/150/160. In this case, each connecting terminal 190 may contact a corresponding one of the UBMs 155 of the re-distribution pattern 150. The connecting terminals 190 may also be disposed on the re-distribution pattern 180 of the upper re-distribution layer 170/180. In this case, the connecting terminals 190 may contact respective connecting pads 185. For example, each connecting terminal 190 may be a solder ball or a solder bump. The connecting terminals 190 may electrically connect the lower semiconductor package 100 and the upper semiconductor package 300.

The upper semiconductor package 300 may be bonded to the lower semiconductor package 100 using a flip-chip bonding process. The upper semiconductor package 300 may be electrically connected to the inner semiconductor chip 120 by the connecting terminals 190 and the upper re-distribution layer 170/180. For example, the upper semiconductor package 300 may include a memory semiconductor chip and the memory semiconductor package 300 may include a volatile memory semiconductor chip such as DRAM or SRAM or a non-volatile memory semiconductor chip such as RRAM, MRAM, FeRAM or RRAM.

Figure 3:
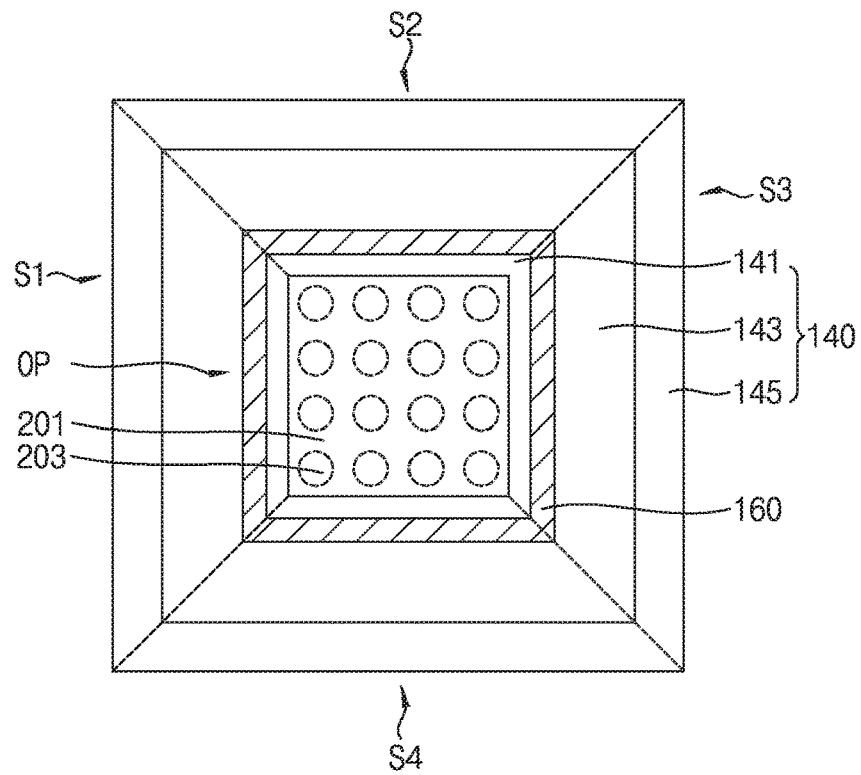
FIG. 3 is a top view of a portion A in the semiconductor package 10A according to the exemplary embodiment of the disclosure shown in FIG. 2.
Figure 4:
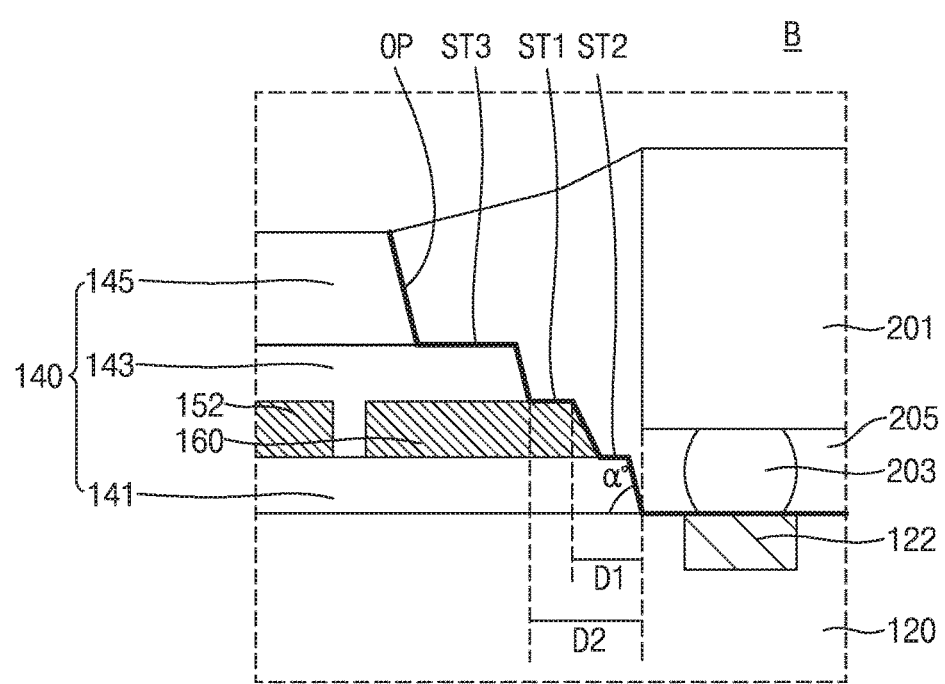
FIG. 4 is an enlarged view of a portion B in the semiconductor package 10A according to the exemplary embodiment of the disclosure shown in FIG. 2.

FIG. 3 is a top view of a portion A in the semiconductor package 10A according to the exemplary embodiment of the disclosure shown in FIG. 2. FIG. 4 is an enlarged view of a portion B in the semiconductor package 10A according to the exemplary embodiment of the disclosure shown in FIG. 2.

Referring to FIGS. 2 and 3, the lower re-distribution layer 140/150/160 may include a barrier layer 160 disposed on the first insulating layer 141. The barrier layer 160 may be disposed at the same level as the wiring layer 152 contacting an upper surface of the first insulating layer 141. When viewed in a top view, the barrier layer 160 may surround the lower semiconductor chip 200. For example, the barrier layer 160 may have a quadrangular ring shape when viewed in a top view. The barrier layer 160 may be spaced apart from the lower semiconductor chip 200 when viewed in a top view.

Referring to FIGS. 2 to 4, the lower re-distribution layer 140/150/160 may have an opening OP extending through the insulating layer 140 and the barrier layer 160 to partially expose the lower surface of the inner semiconductor chip 120. The lower semiconductor chip 200 may be disposed within the opening OP. The opening OP may be defined by an inner side surface of the insulating layer 140, an upper surface of the insulating layer 140, an inner side surface of the barrier layer 160, and an upper surface of the barrier layer 160. The inner side surfaces and upper surfaces of the lower re-distribution layer 140/150/160 defining the opening OP may form a stepped structure. The stepped structure may have four stepped structures S1, S2, S3 and S4 surrounding the lower semiconductor chip 200 when viewed in a top view.

The lower re-distribution layer 140/150/160 having the stepped structure may include a stepped surface. In an exemplary embodiment, the lower re-distribution layer 140/150/160 may include a plurality of stepped surfaces ST1, ST2 and ST3. The plurality of stepped surfaces ST1, ST2 and ST3 may include a first stepped surface ST1, at which the upper surface of the barrier layer 160 is exposed, and second and third stepped surfaces ST2 and ST3, at which the upper surface of the insulating layer 140 is exposed. In an exemplary embodiment, any one of the second and third stepped surfaces ST2 and ST3 may be omitted. That is, the upper surface of the first insulating layer 141 may be completely covered by the barrier layer 160, or an upper surface of the second insulating layer 143 may be completely covered by the third insulating layer 145.

The inner side surface of the lower re-distribution layer 140/150/160 may have an inclination with respect to the lower surface of the inner semiconductor chip 120. For example, the inner side surface of the barrier layer 160 may have an inclination with respect to a lower surface of the barrier layer 160. In addition, the inner side surface of the insulating layer 140 may have an inclination with respect to a lower surface of the insulating layer 140. For example, an angle α° formed between the inner side surface of the insulating layer 140 and the lower surface of the insulating layer 140 may be about 60 to 80°.

The mold layer 205 of the lower semiconductor chip 200 may completely cover a side surface of the body 201. The mold layer 205 may fill the opening OP such that the mold layer 205 extends through the lower re-distribution layer 140/150/160. The mold layer 205 may cover the side and upper surfaces of the insulating layer 140 and the side and upper surfaces of the barrier layer 160. In an exemplary embodiment, the body 201 of the lower semiconductor chip 200 may vertically overlap with the first insulating layer 141.

In an exemplary embodiment, an upper surface of the mold layer 205 may connect an edge of the lower re-distribution layer 140/150/160 disposed at an uppermost level (that is, an edge of the third insulating layer 145) and an edge of the body 201 of the lower semiconductor chip 200. The upper surface of the mold layer 205 may have an inclination with respect to the lower surface of the inner semiconductor chip 120. In an exemplary embodiment, a maximum horizontal distance D1 between the side surface of the body 201 and the inner side surface of the barrier layer 160 may be smaller than a minimum horizontal distance D2 between the side surface of the body 201 and the inner side surface of the second insulating layer 143.

Figure 5A:
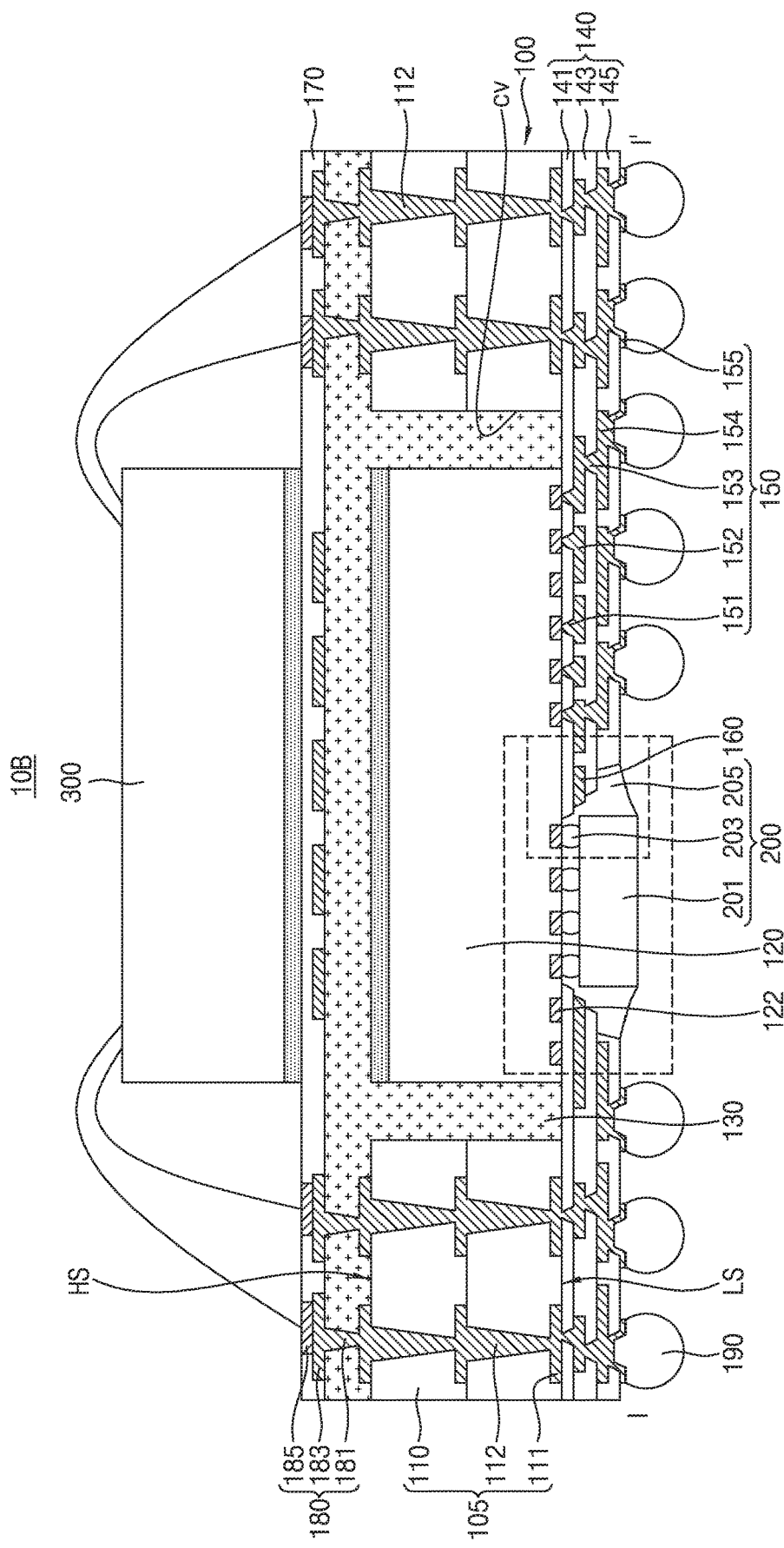
FIG. 5A is a cross-sectional view of a semiconductor package 10B according to an exemplary embodiment of the disclosure taken along line I-I' in FIG. 1.

FIG. 5A is a cross-sectional view of a semiconductor package 10B according to an exemplary embodiment of the disclosure taken along line I-I' in FIG. 1. Referring to FIG. 5A, the lower semiconductor package 100 and the upper semiconductor package 300 may be electrically connected by conductive wires. The upper semiconductor package 300 may contact the insulating layer 170 of the upper re-distribution layer 170/180.

Figure 5B:
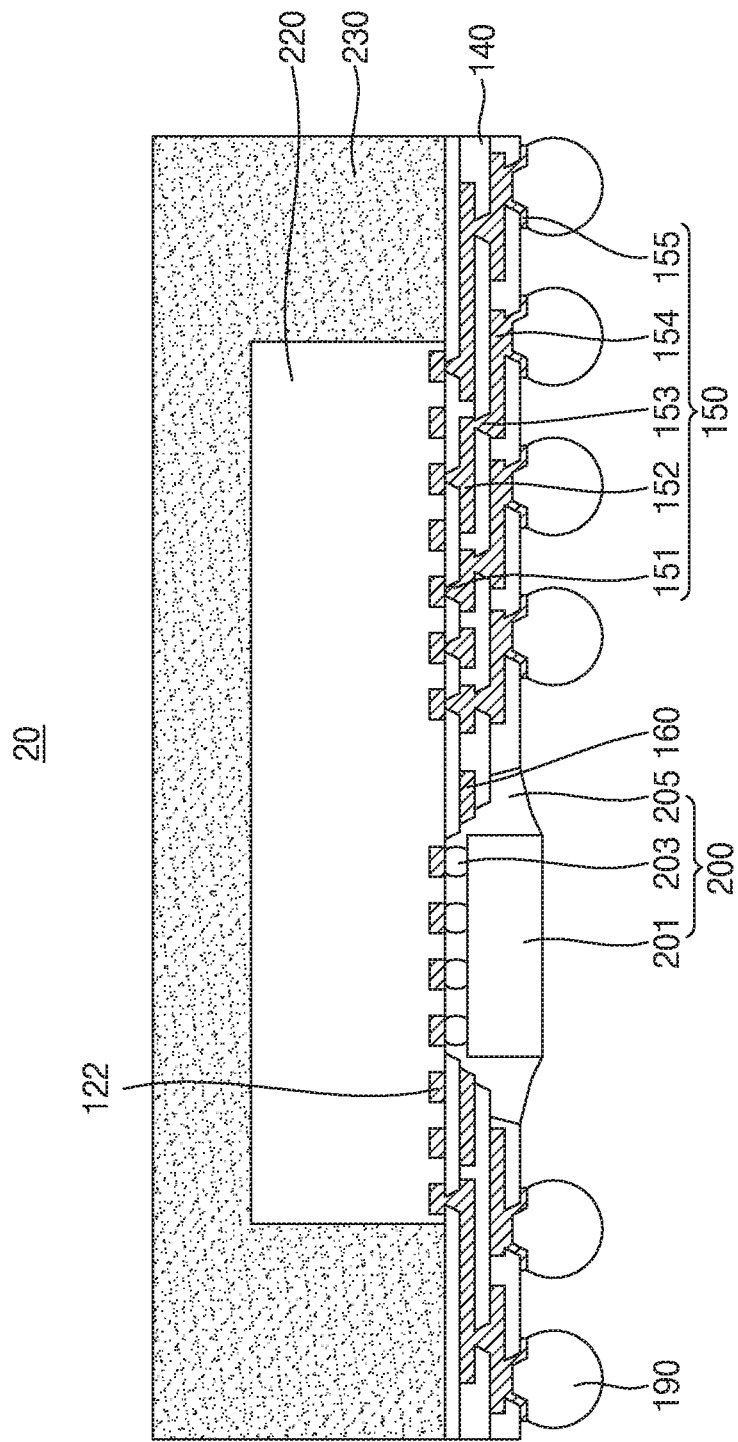
FIG. 5B is a cross-sectional view of a semiconductor package 20 according to an exemplary embodiment of the disclosure.

FIG. 5B is a cross-sectional view of a semiconductor package 20 according to an exemplary embodiment of the disclosure. The semiconductor package 20 according to the exemplary embodiment of the disclosure may be a wafer-level package. For example, the semiconductor package 20 may be a fan-out wafer-level package (FOWLP) as shown in FIG. 5B. Alternatively, the semiconductor package 20 may be a fan-in wafer-level package (FIWLP). In an exemplary embodiment, the fan-out wafer-level package may be included in a mounted package-on-package (PoP) type package. Referring to FIG. 5B, the semiconductor package 20 may include an inner semiconductor chip 220, a mold layer 230, a re-distribution layer 140/150/160, connecting terminals 190, and a lower semiconductor chip 200. For example, the mold layer 230 may include an epoxy molding compound (EMC).

Figure 6:
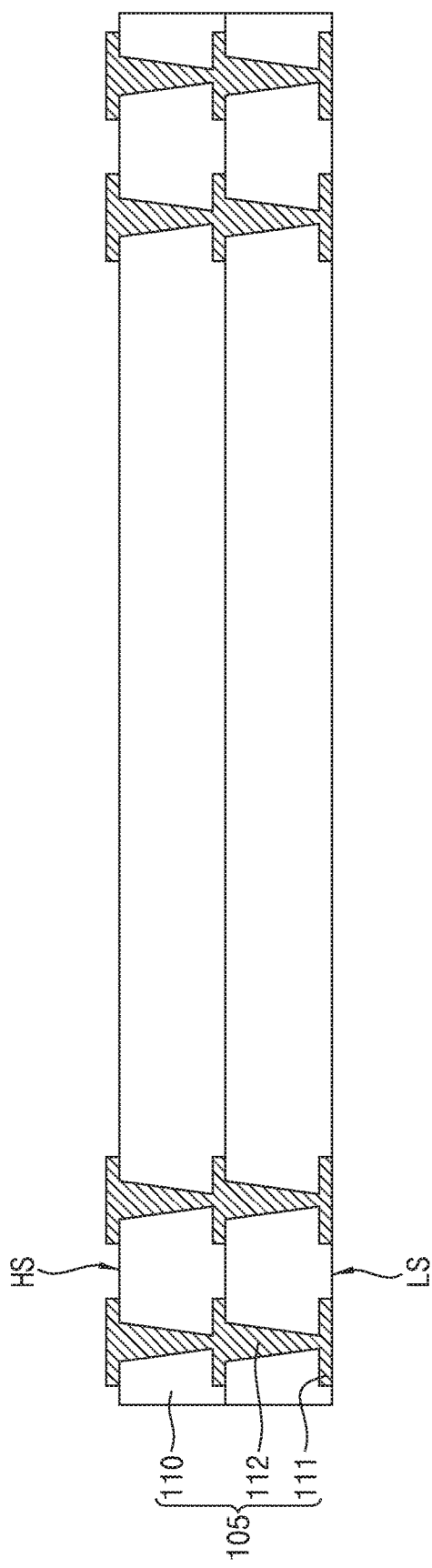

FIGS. 6 to 20 are cross-sectional views explaining a semiconductor package manufacturing method according to an exemplary embodiment of the disclosure. FIG. 6 shows a cross-section of a region usable for a unit package in a frame 105. The frame 105 may have various sizes for easy mass production. In connection with this, in the method, a frame 105 having a large size may be prepared, and a plurality of semiconductor packages may be manufactured using the frame 105. Thereafter, the semiconductor packages may be singulated into individual packages through a sawing process.

Figure 7:
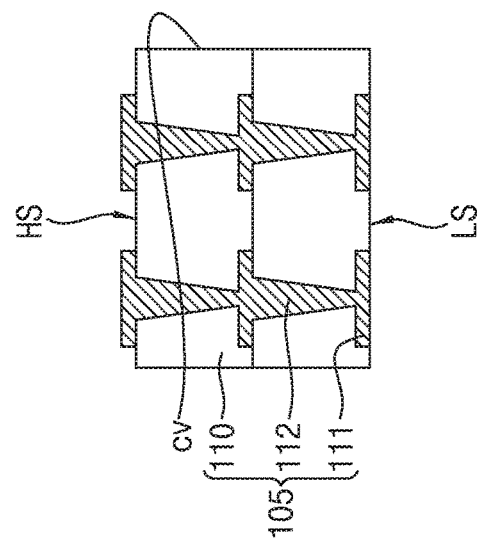

Referring to FIGS. 6 and 7, the method may include preparing a frame 105 including a core 110, connecting pads 111 and through-silicon-vias (TSVs) 112, and forming a cavity CV extending through the frame 105. For example, formation of the cavity CV may be carried out through mechanical drilling and/or laser drilling, a sand blasting process using abrasive grains, a dry etching process using plasma, or the like.

Referring to FIG. 8, the method may include attaching an adhesive film 115 to a lower surface of the frame 105, and disposing an inner semiconductor chip 120 within the cavity CV of the core 110. For example, the adhesive film 115 may be an ajinomoto build-up film (ABF). The adhesive film 115 may function as a support film to support the inner semiconductor chip 120. The adhesive film 115 may cover lower surfaces of the connecting pads 111 and/or a lower surface of the core 110.

The inner semiconductor chip 120 may be attached to the adhesive film 115 while being disposed within the cavity CV of the core 110. The inner semiconductor chip 120 may be disposed to be spaced apart from an inner side surface of the cavity CV. As a result, a space may be formed between an inner side surface of the core 110 and a side surface of the inner semiconductor chip 120.

Chip pads 122 are disposed at a lower surface of the inner semiconductor chip 120. The inner semiconductor chip 120 may be disposed in a face-down manner such that the chip pads 122 are directed downwards. The lower surface of the inner semiconductor chip 120 and lower surfaces of the chip pads 122 may be completely covered by the adhesive film 115.

Referring to FIG. 9, the method may include forming an encapsulator 130 in a space between the core 110 and the inner semiconductor chip 120. The encapsulator 130 may completely fill a space defined in the cavity CV between the inner side surface of the core 110 and the side surface of the inner semiconductor chip 120. The encapsulator 130 may contact an upper surface of the adhesive film 115. The encapsulator 130 may serve to fix the inner semiconductor chip 120 and, as such, it may be possible to minimize a problem caused by movement of the inner semiconductor chip 120 in a subsequent process.

Figure 10:
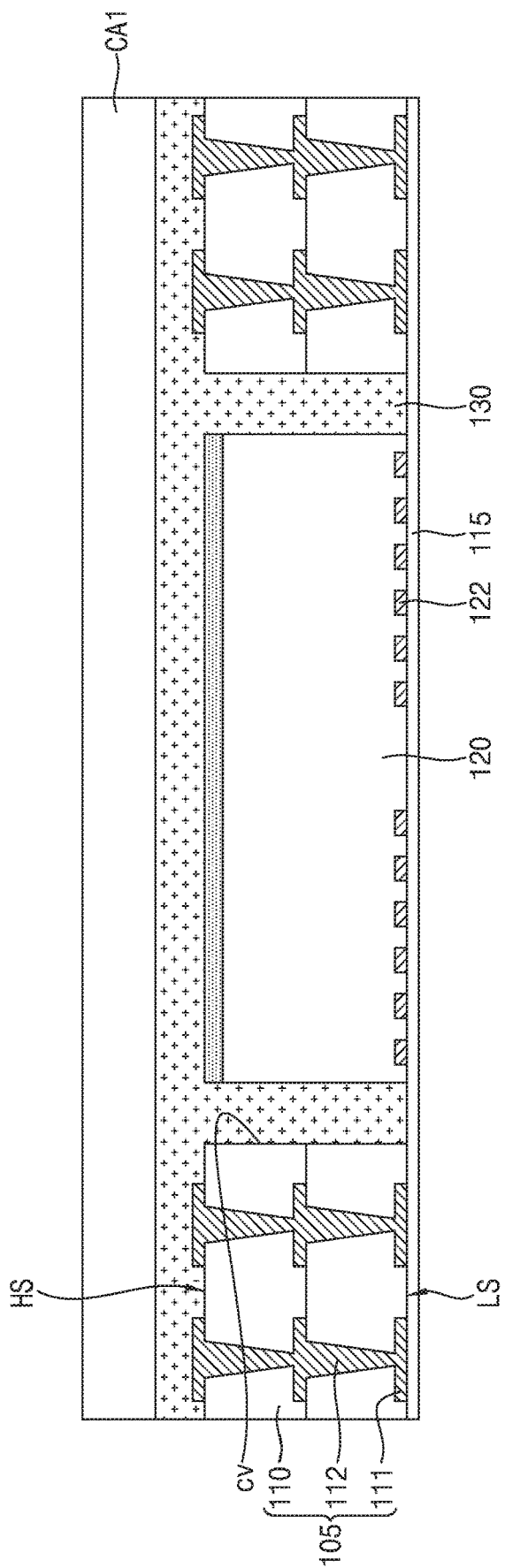
Figure 11:
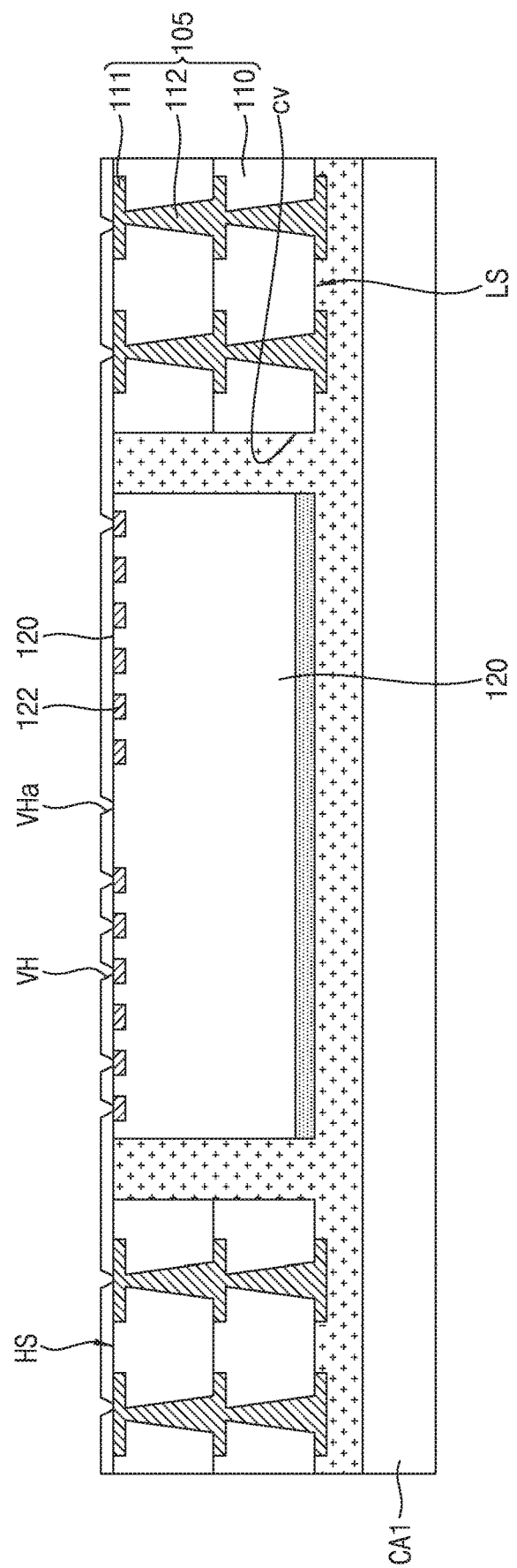
Figure 12:
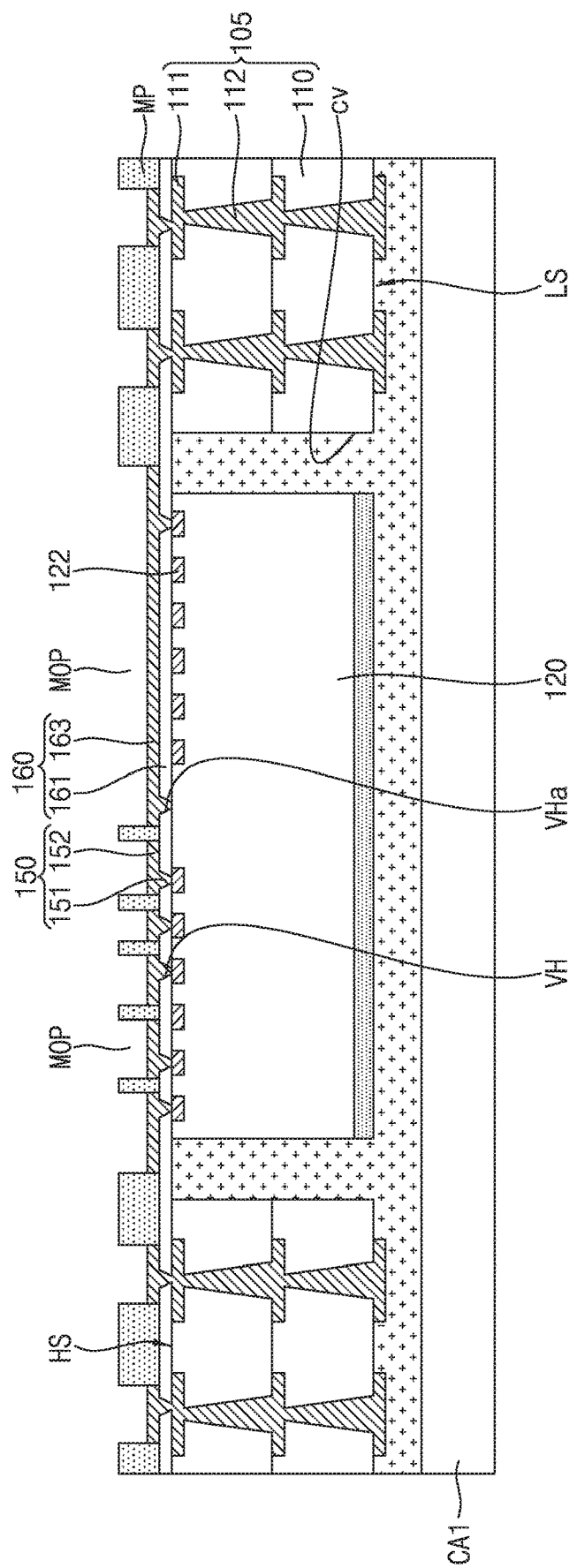
Figure 13:
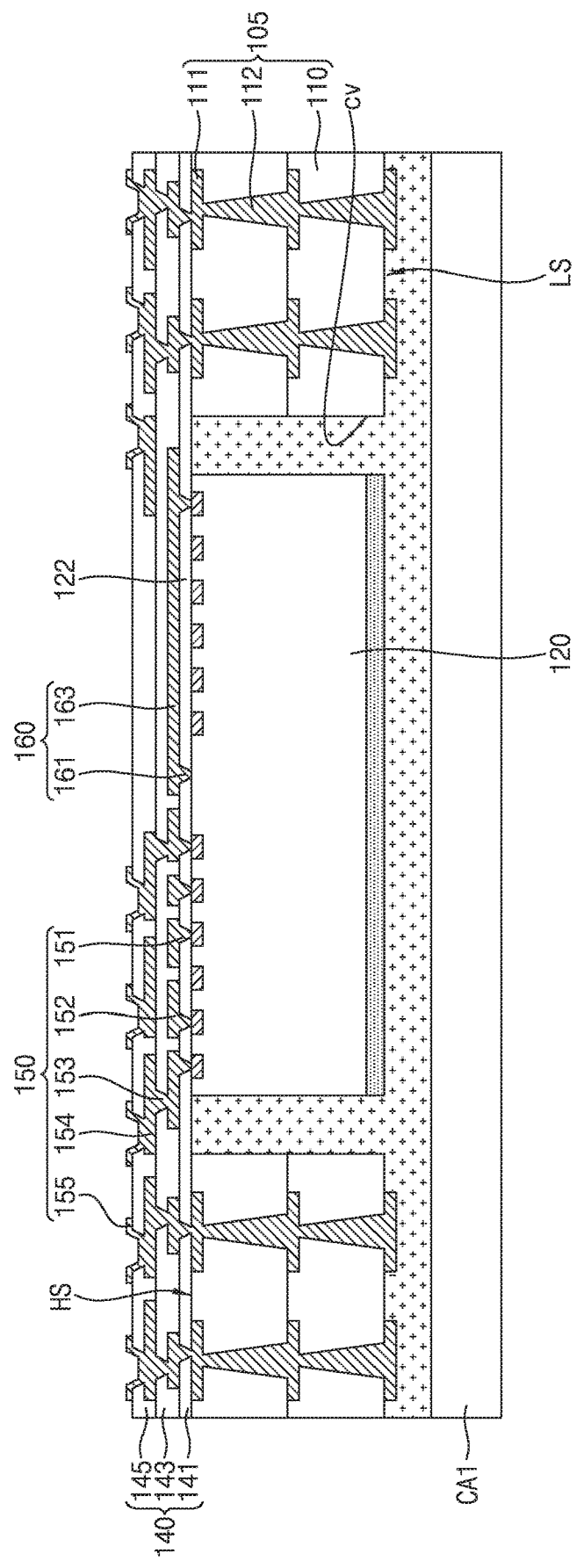

Referring to FIG. 10, the method may include attaching a first carrier substrate CA1 to the frame 105 and the inner semiconductor chip 120, and removing the adhesive film 115. Referring to FIGS. 11 to 13, the method may also include forming a lower re-distribution layer 140/150/160 on the lower surface of the frame 105. Formation of the lower re-distribution layer 140/150/160 may include forming an insulating layer 140, forming a re-distribution pattern 150, and forming a barrier layer 160.

Referring to FIG. 11, the resultant structure obtained after attachment of the first carrier substrate CA1 is inverted such that the first carrier substrate CA1 is directed downwards, and the chip pads 122 are directed upwards. Thereafter, the method may include forming a first insulating layer 141 on the lower surface of the frame 105. The first insulating layer 141 may cover an exposed lower surface of the frame 105, a lower surface of the encapsulator 130, and lower and side surfaces of the connecting pads 111. The first insulating layer 141 may also cover an exposed surface of the inner semiconductor chip 120. In addition, the first insulating layer 141 may cover exposed surfaces of the chip pads 122 of the inner semiconductor chip 120. Via holes VH may be formed through partial removal of the first insulating layer 141. The via holes VH may be formed to vertically overlap with portions of the connecting pads 111 and selective ones of the chip pads 122 of the inner semiconductor chip 120, respectively. In an exemplary embodiment, the via holes VH may include via holes VHa vertically overlapping with the inner semiconductor chip 120 without overlap thereof with the chip pads 122. For example, the via holes VH may be formed through light exposure. Alternatively, the via holes VH may be formed through a laser drilling method using an ultraviolet (UV) laser or an excimer laser.

Referring to FIG. 12, the method may include forming a mask pattern MP, and forming a first re-distribution pattern 151/152 and a barrier layer 160. The mask pattern MP, which includes mask openings MOP, may be formed on the first insulating layer 141. For example, the mask pattern MP may include a photoresist. The first re-distribution pattern 151/152 and the barrier layer 160 may be formed to completely fill the via holes VH while filling at least a part of the mask openings MOP. The first re-distribution pattern 151/152 may include vias 151 respectively formed in selective ones of the via holes VH while being respectively connected to corresponding ones of the connecting pads 111 and the chip pads 122, and a wiring layer 152 having portions each formed between adjacent portions of the mask pattern MP to be connected to a corresponding one of the vias 151. The barrier layer 160 may include vias 161 respectively formed in the via holes VHa, and a plate layer 163 having portions respectively formed in the mask openings MOP to be connected to corresponding ones of the vias 161. In an exemplary embodiment, the barrier layer 160 may not include the vias 161 while including the plate layer 163. When the via holes VHa are omitted from the first insulating layer 141, the vias 161 may also be omitted. The plate layer 163 may be formed to have a greater horizontal area than the wiring layer 152 of the first re-distribution pattern 151/152. The plate layer 163 may be formed to vertically overlap with a plurality of chip pads 122 of the inner semiconductor chip 120. For example, the plurality of chip pads 122 vertically overlapping with the plate layer 163 may be arranged in the form of a lattice pattern when viewed in a top view (see, e.g., FIG. 17).

For example, the first re-distribution pattern 151/152 and the barrier layer 160 may include copper. After formation of the first re-distribution pattern 151/152 and the barrier layer 160, the mask pattern MP may be removed through ashing or stripping.

In an exemplary embodiment, the first re-distribution pattern 151/152 and the barrier layer 160 may be formed through a plating method. For example, the plating method for forming the first re-distribution pattern 151/152 and the barrier layer 160 may include an electro plating method, an electroless plating method and/or an immersion plating method. When the first re-distribution pattern 151/152 and the barrier layer 160 are formed through a plating method, a seed layer covering the connecting pads 111 of the frame 105 and the chip pads 122 of the inner semiconductor chip 120 may be formed before formation of the mask pattern MP.

Referring to FIG. 13, the method may include forming a second insulating layer 143, a second re-distribution pattern 153/154, a third insulating layer 145, and UBMs 155, thereby forming a lower re-distribution layer 140/150/160. The second insulating layer 143 and the second re-distribution pattern 153/154 may be formed in the same manner as that of the first insulating layer 141 and the first re-distribution pattern 151/152. The second re-distribution pattern 153/154 may be electrically connected to the first re-distribution pattern 151/152. The barrier layer 160 may be electrically insulated from the second re-distribution pattern 153/154. An upper surface of the barrier layer 160 may be completely covered by the second insulating layer 143.

The third insulating layer 145 may be formed to cover an upper surface of the second insulating layer 143 and upper and side surfaces of the second re-distribution pattern 153/154. Through holes may be formed at the third insulating layer 145, and the UBMs 155 may be formed in respective through holes. For example, the third insulating layer 145 may be an ajinomoto build-up film (ABF).

Figure 14:
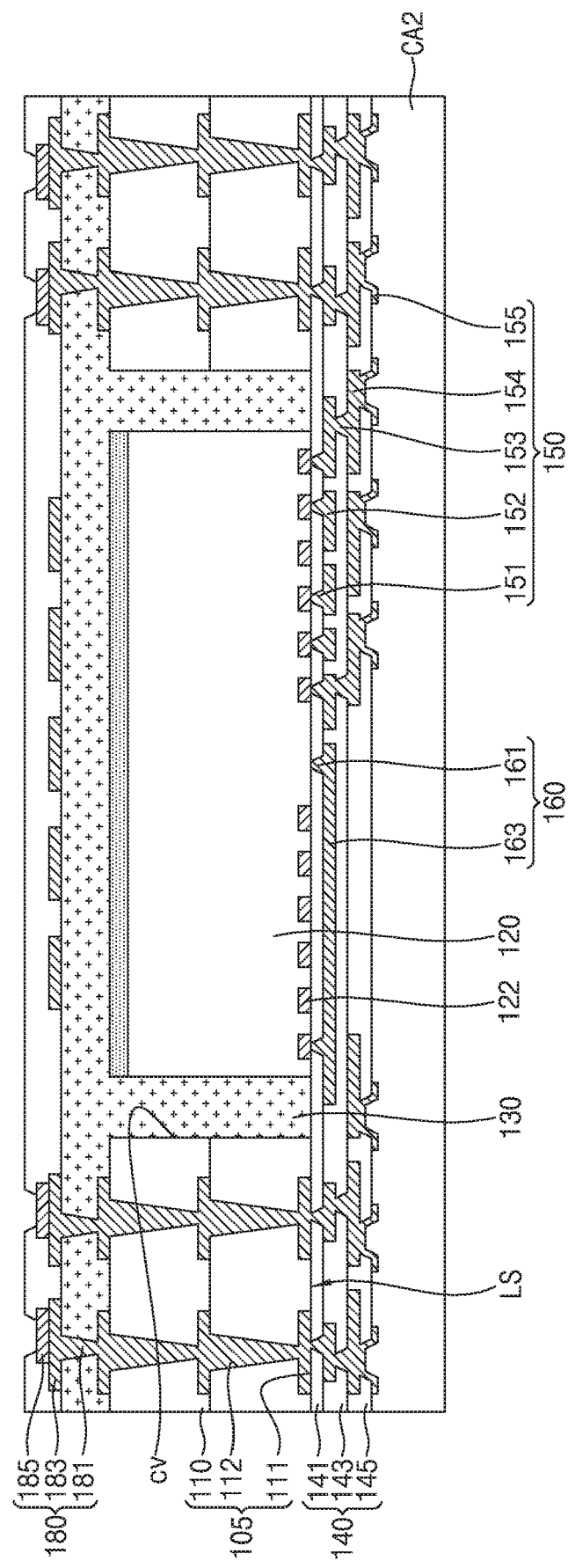

Referring to FIG. 14, the method may include attaching a second carrier substrate CA2 to an upper surface of the lower re-distribution layer 140/150/160, and forming an upper re-distribution layer 170/180 on an upper surface of the frame 105. The second carrier substrate CA2 may be attached to the upper surface of the lower re-distribution layer 140/150/160, and the resultant structure obtained after attachment of the second carrier substrate CA2 may then be inverted such that the lower re-distribution layer 140/150/160 and the carrier substrate CA2 are directed downwards. Thereafter, the upper re-distribution layer 170/180, which includes an insulating layer 170 and a re-distribution pattern 180, may be formed on upper surfaces of the frame 105 and the inner semiconductor chip 120. The method of forming the upper re-distribution layer 170/180 may be identical or similar to the method of forming the lower re-distribution layer 140/150/160. The re-distribution pattern 180 of the upper re-distribution layer 170/180 may include vias 181, a wiring layer 183, and connecting pads 185. After formation of the upper re-distribution layer 170/180, the second carrier substrate CA2 may be removed.

Figure 15:
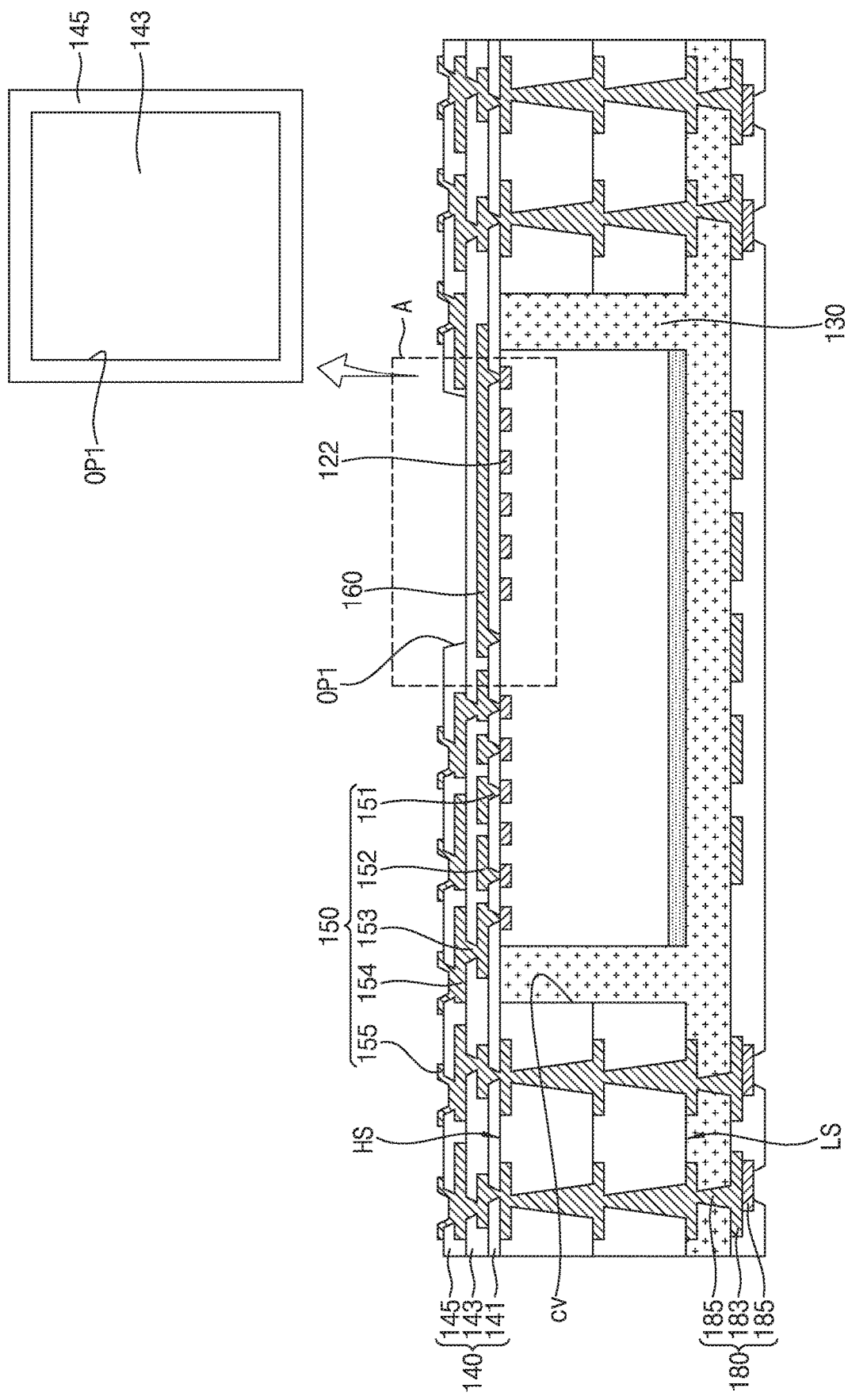

Referring to FIG. 15, the method may include a first opening OP1 through which the second insulating layer 143 is exposed. After inversion of the resultant structure obtained after removal of the second carrier substrate CA2 such that the lower re-distribution layer 140/150/160 is directed upwards, the first opening OP1 may be formed through removal of a portion of the third insulating layer 145. The first opening OP1 may be formed to vertically overlap with the barrier layer 160.

For formation of the first opening OP1, a laser drilling method using a laser and a laser wavelength optimized for removal of the third insulating layer 145 may be used. In an exemplary embodiment, for formation of the first opening OP1, a laser drilling method using a $CO_2$ laser or an excimer laser may be used. For example, when the third insulating layer 145 is an ajinonmoto build-up film (ABF), the first opening OP1 may be formed using a $CO_2$ laser having a wavelength of 10.6 μm. As the first opening OP1 is formed by a laser, an inner side surface of the third insulating layer 145 may have an inclination.

Figure 16:
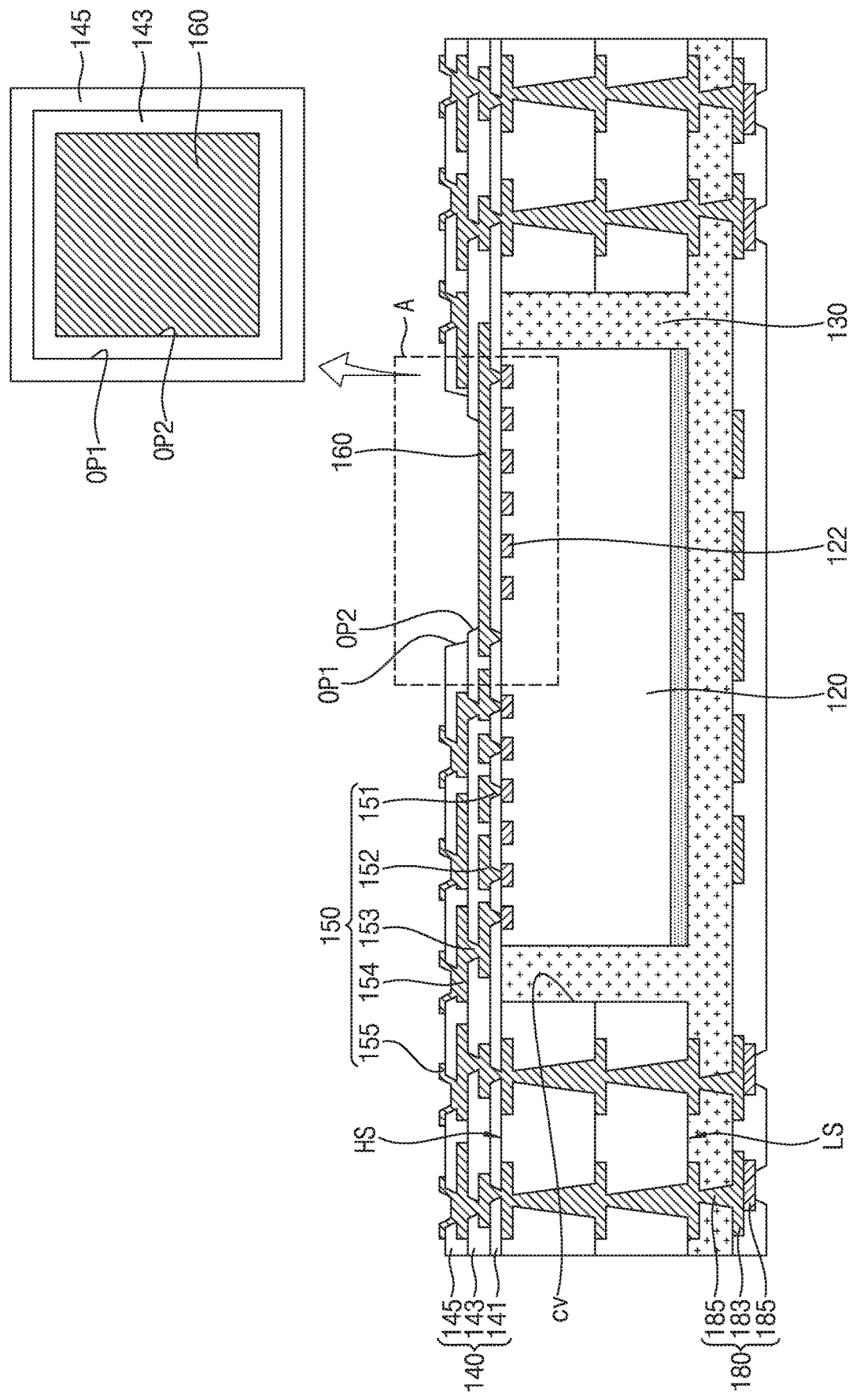

Referring to FIG. 16, the method may include forming a second opening OP2 through which the barrier layer 160 is exposed. A portion of the second insulating layer 143 exposed through the first opening OP1 is removed to form the second opening OP2 through which an upper surface of the barrier layer 160 is exposed. The second opening OP2 may have a maximum horizontal width (the width of an upper end of the second opening OP2) smaller than a minimum horizontal width of the first opening OP1 (the width of a lower end of the first opening OP1). An upper surface of the second insulating layer 143 defining the second opening OP2 may be exposed through the first opening OP1. In an exemplary embodiment, the maximum horizontal width of the second opening OP2 may be substantially equal to the minimum horizontal width of the first opening OP1 and, as such, the upper surface of the second insulating layer 143 may be completely covered by the upper surface of the third insulating layer 145. For formation of the second opening OP2, a laser drilling method using a laser and a laser wavelength optimized for removal of the second insulating layer 143 may be used. In an exemplary embodiment, for formation of the second opening OP2, a laser drilling method using a $CO_2$ laser or an excimer laser may be used. For example, when the second insulating layer 143 is a photo-imageable dielectric (PID), the second opening OP2 may be formed using an excimer laser having a wavelength of 248 to 308 nm. As the second opening OP2 is formed by a laser, an inner side surface of the second insulating layer 143 may have an inclination.

Horizontal cross-sectional areas of the first and second openings OP1 and OP2 may be smaller than a horizontal cross-sectional area of the barrier layer 160. The first and second openings OP1 and OP2 may vertically completely overlap with the barrier layer 160.

Figure 17:
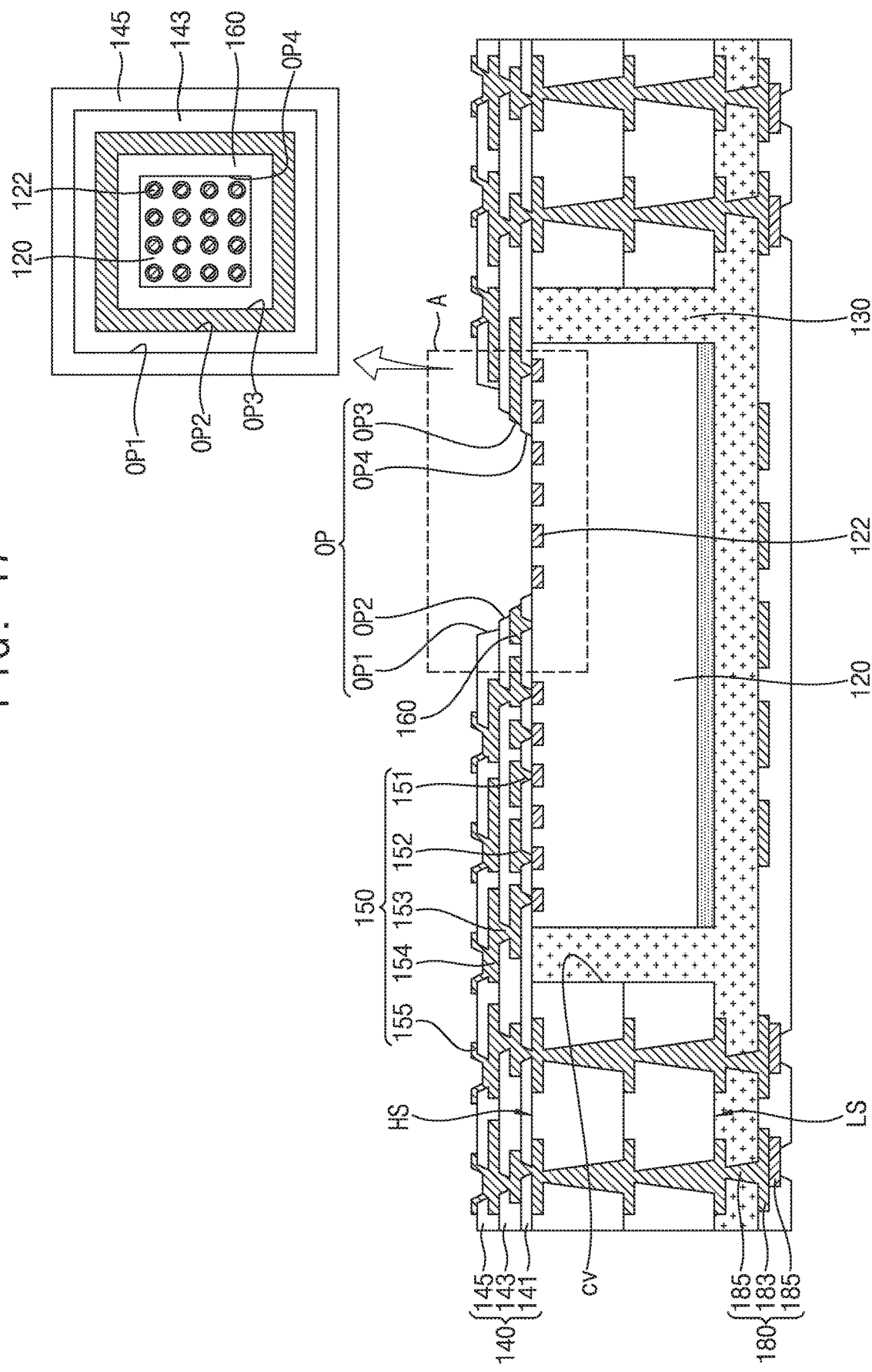

Referring to FIG. 17, the method may include sequentially forming a third opening OP3 and a fourth opening OP4, thereby forming a single opening OP extending through the lower re-distribution layer 140/150/160. The third opening OP3, through which an upper surface of the first insulating layer 141 is exposed, may be formed in accordance with removal of a portion of the barrier layer 160 exposed through the second opening OP2. The third opening OP2 may have a maximum horizontal width (the width of an upper end of the third opening OP3) smaller than a minimum horizontal width of the second opening OP2 (the width of a lower end of the second opening OP2). In this case, the upper surface of the barrier layer 160 may be partially exposed through the second opening OP2. For formation of the third opening OP3, a laser drilling method using a laser and a laser wavelength optimized for removal of the barrier layer 160 may be used. In an exemplary embodiment, for formation of the third opening OP3, a laser drilling method using a UV laser may be used. For example, when the barrier layer 160 is copper (Cu), the third opening OP3 may be formed using a UV laser having a wavelength of 355 nm. As the third opening OP3 is formed by a laser, an inner side surface of the barrier layer 160 may have an inclination.

The inner semiconductor chip 120 may be subjected to thermal damage by a laser during a procedure of forming the opening OP. In connection with this, during removal of insulating layers 140 at a higher level than the barrier layer 160, the barrier layer 160, which is disposed adjacent to the inner semiconductor chip 120, may prevent application of thermal energy to the inner semiconductor chip 120 by a laser. In particular, in a laser drilling process of forming the first and second openings OP1 and OP2, the barrier layer 160 may prevent a laser from advancing toward the inner semiconductor chip 120 and, as such, thermal damage to the inner semiconductor chip 120 caused by the laser drilling process may be minimized.

Thereafter, a portion of the first insulating layer 141 exposed through the third opening OP3 may be removed to form a fourth opening OP4 through which a surface of the inner semiconductor chip 1209 and the chip pads 122 are exposed. For formation of the fourth opening OP4, a laser having a picosecond or femtosecond pulse width may be used. When the first insulating layer 141 directly contacting the inner semiconductor chip 120 is removed using a laser having a picosecond or femtosecond pulse width, it may be possible to minimize thermal damage to the inner semiconductor chip 120. As the fourth opening OP4 is formed by a laser, an inner side surface of the first insulating layer 141 may have an inclination.

Figure 18:
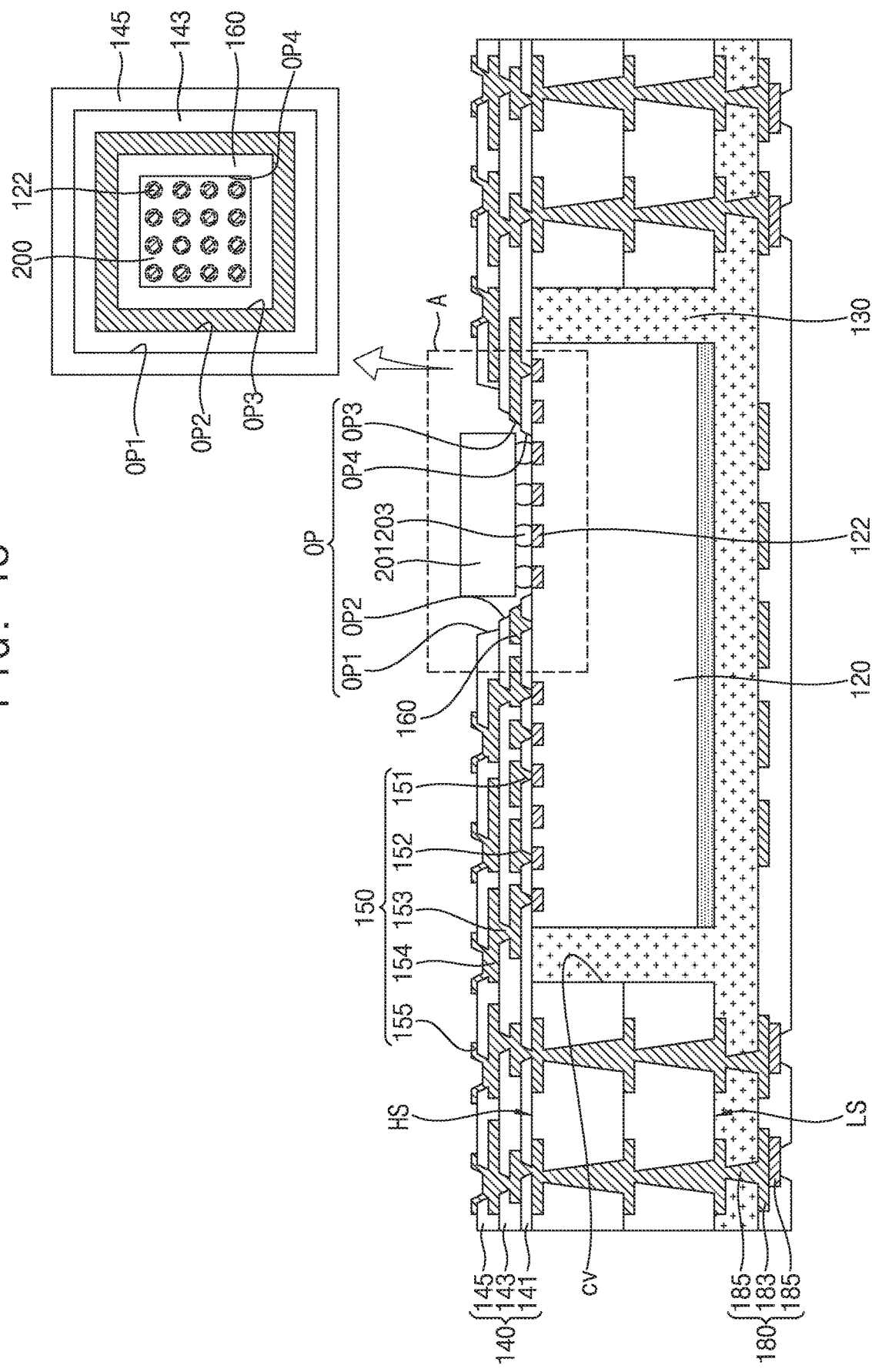
Figure 19:
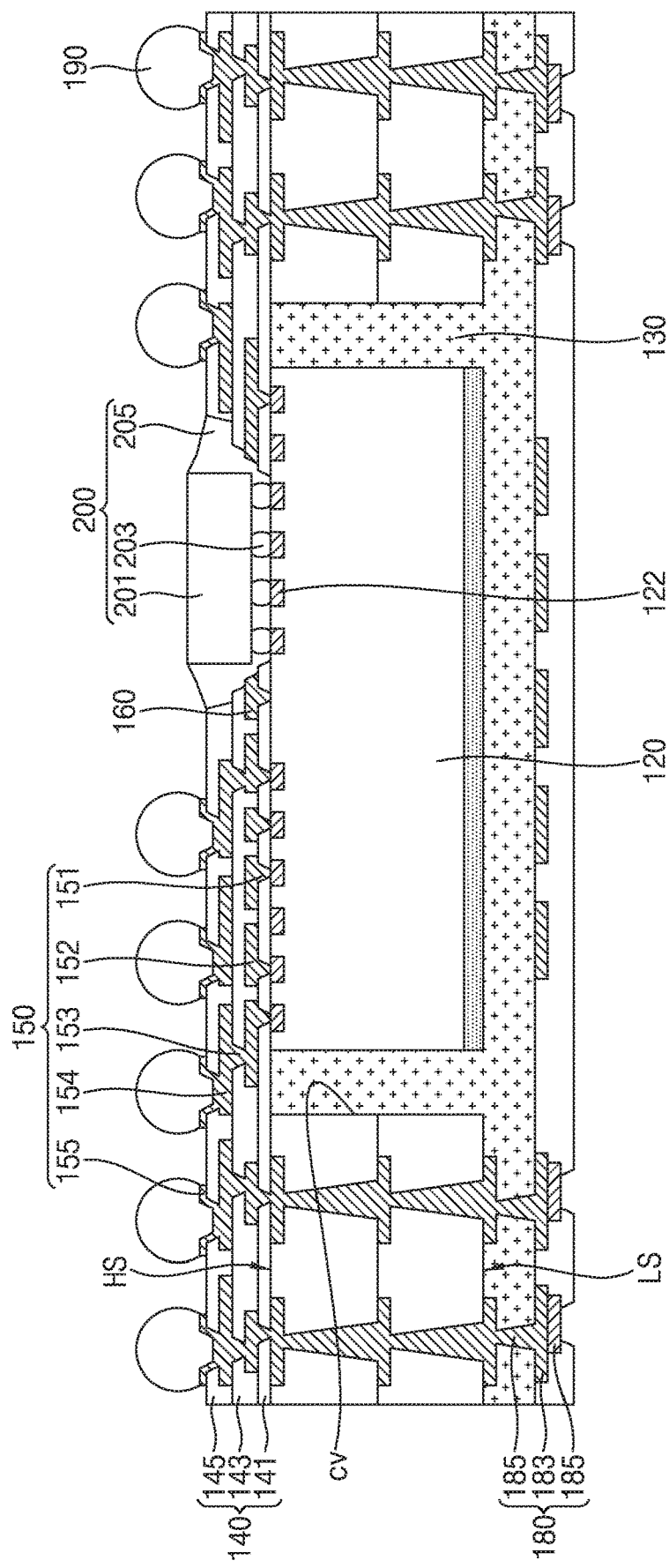

Referring to FIGS. 18 and 19, the method may include disposing a lower semiconductor chip 200 within the opening OP. The lower semiconductor chip 200 may be mounted on the inner semiconductor chip 120 exposed through the opening OP. Solder balls 203 of the lower semiconductor chip 200 may electrically connect the chip pads 211 of the inner semiconductor chip 120 and a body 201 of the lower semiconductor chip 200.

A mold layer 205 may be formed such that the mold layer 205 is interposed between the body 201 of the lower semiconductor chip 200 and the lower re-distribution layer 140/150/160. The mold layer 205 may be formed to fill the opening OP. The mold layer 205 may be formed to cover side and lower surfaces of the body 201, exposed surfaces of the solder balls 203, and an inner side surface of the lower re-distribution layer 140/150/160. For example, the mold layer 205 may include an epoxy molding compound (EMC).

The method may include forming connecting terminals 190 on respective UBMs 155 of the lower re-distribution layer 140/150/160. For example, each connecting terminal 190 may be a bump. The lower semiconductor chip 200 is directly mounted on the inner semiconductor chip 120 through the lower re-distribution layer 140/150/160 and, as such, the height of the lower semiconductor chip 200 protruding beyond a lower surface of the insulating layer 140 may be reduced. As such, the size of each connecting terminal 190 may be correspondingly reduced. As a result, the total height of the semiconductor package may be reduced. In addition, the routing distance between the lower semiconductor chip 200 and the inner semiconductor chip 120 may be reduced and, as such, the total performance of the semiconductor package may be enhanced.

Figure 20:
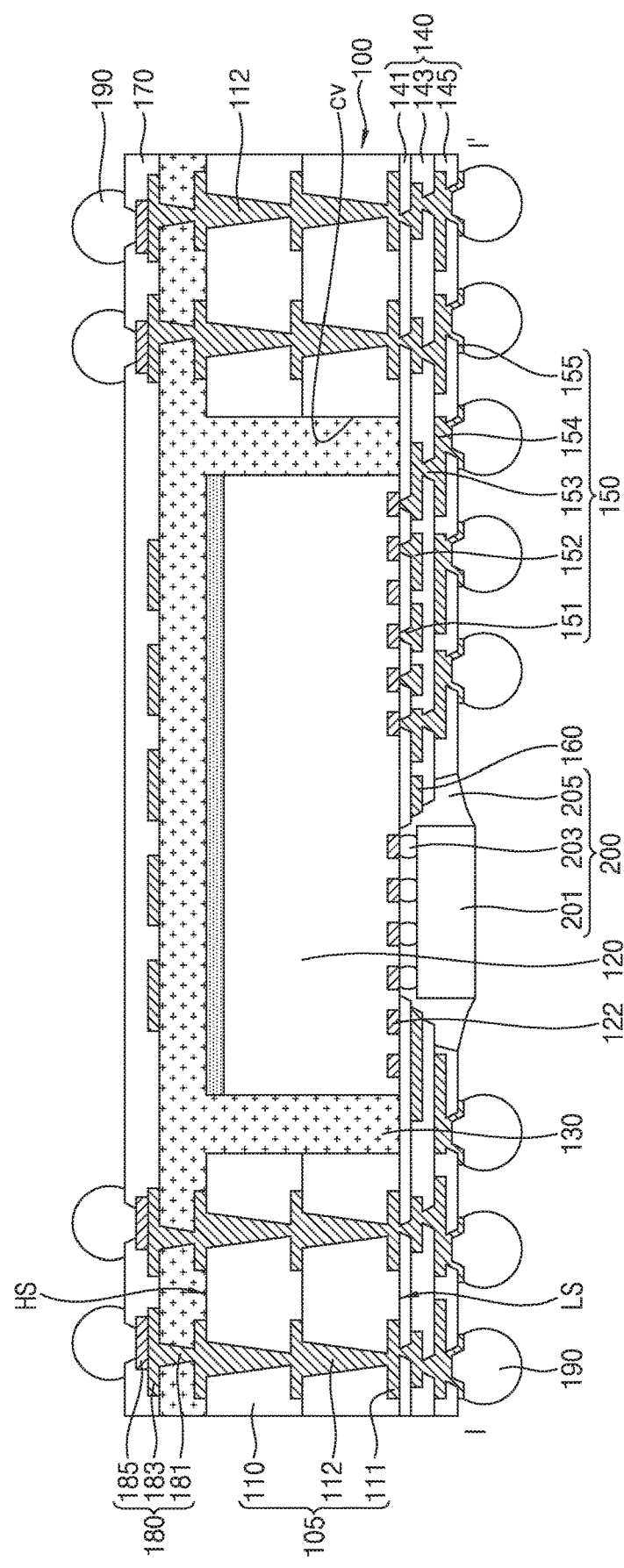

Referring to FIG. 20, the method may include disposing connecting terminals 190 on the upper re-distribution layer 170/180. Again, referring to FIG. 2, the method may include forming an upper semiconductor package 300 on the connecting terminals 190.

In semiconductor packages according to exemplary embodiments of the disclosure, a passive element is directly mounted on a semiconductor chip and, as such, the routing distance between the semiconductor chip and the passive element may be reduced, and characteristics of the semiconductor chip and the passive element may be improved. In addition, each semiconductor package may have a reduced total height and, as such, may have high utility for electronic products.

In the semiconductor packages according to exemplary embodiments of the disclosure, a barrier layer for blocking a laser is included in a re-distribution layer and, as such, it may be possible to avoid thermal damage to the semiconductor chip in a laser drilling process of opening the re-distribution layer.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A packaged integrated circuit device, comprising:
   a frame having a cavity therein;
   an inner semiconductor chip within the cavity;
   a lower re-distribution layer extending adjacent lower surfaces of the frame and the inner semiconductor chip, said lower re-distribution layer having an opening therein which at least partially exposes the lower surface of the inner semiconductor chip; and
   a lower semiconductor chip adjacent the lower surface of the inner semiconductor chip, and within the opening in the lower re-distribution layer, which comprises: (i) an insulating layer covering the lower surface of the frame, (ii) a re-distribution pattern disposed on the insulating layer, and (iii) a barrier layer, which is disposed on the insulating layer and surrounds at least a portion of the lower semiconductor chip.

2. The device of claim 1, wherein the barrier layer has a generally quadrangular rim shape when viewed from a top plan view perspective.

3. The device of claim 1, wherein the lower semiconductor chip comprises:
   a body disposed on the lower surface of the inner semiconductor chip;
   a solder ball electrically connecting the body and the inner semiconductor chip; and
   a mold layer extending between the body and the lower re-distribution layer.

4. The device of claim 3, wherein the mold layer fills the opening and completely covers a side surface of the body while extending through the lower re-distribution layer.

5. The device of claim 4, wherein an upper surface of the opening of the lower re-distribution layer comprises a first stepped surface, at which an upper surface of the barrier layer is partially exposed.

6. The device of claim 5, wherein the upper surface of the opening of the lower re-distribution layer further comprises a second stepped surface at which an upper surface of the insulating layer is partially exposed.

7. The device of claim 1, wherein the barrier layer has an inclined side surface.

8. The device of claim 1, wherein an inner side surface of the insulating layer is inclined at an angle of about 60° to about 80°.

9. The device of claim 1, further comprising:
an upper re-distribution layer disposed on the frame and the inner semiconductor chip, the upper-redistribution layer comprising a re-distribution pattern and an insulating layer; and
an upper semiconductor chip disposed on the upper re-distribution layer.

10. The device of claim 9, further comprising a through-silicon-via, which extends through the frame and electrically connects the re-distribution pattern of the lower re-distribution layer and the re-distribution pattern of the upper re-distribution layer.

11. A packaged semiconductor device, comprising:
a frame having a cavity therein;
an inner semiconductor chip within the frame;
a lower re-distribution layer extending adjacent lower surfaces of the frame and the inner semiconductor chip, said lower re-distribution layer comprising a first insulating layer covering at least a portion of the lower surface of the inner semiconductor chip, a re-distribution pattern disposed on the first insulating layer, a barrier layer disposed on the first insulating layer, and a second insulating layer disposed on the barrier layer while partially exposing an upper surface of the barrier layer; and
a lower semiconductor chip adjacent the lower surface of the inner semiconductor chip;
wherein the first insulating layer, the re-distribution pattern, the barrier layer and the second insulating layer of the lower re-distribution layer comprise a stepped structure.

12. The device of claim 11, wherein the stepped structure includes at least four stepped structures surrounding the lower semiconductor chip.

13. The device of claim 11, wherein the lower semiconductor chip comprises:
a body disposed on the lower surface of the inner semiconductor chip;
a solder ball electrically connecting the body and the inner semiconductor chip; and
a mold layer extending between the body and the lower re-distribution layer.

14. The device of claim 13, wherein an upper surface of the mold layer connects an edge of the lower re-distribution layer and an edge of the body of the lower semiconductor chip.

15. The device of claim 13, wherein an upper surface of the mold layer has an inclination with respect to the lower surface of the inner semiconductor chip.

16. The device of claim 13, wherein the re-distribution pattern is electrically connected to the inner semiconductor chip, and the barrier layer is electrically insulated from the inner semiconductor chip.

17. The device of claim 13, wherein at least a portion of the lower semiconductor chip vertically overlaps with a portion of the lower re-distribution layer.

18. A packaged semiconductor device, comprising:
a frame having a cavity therein;
an inner semiconductor chip within the cavity within the frame;
a lower re-distribution layer extending on lower surfaces of the frame and on the inner semiconductor chip; and
a lower semiconductor chip extending on at least a portion of the lower surface of the inner semiconductor chip;
wherein the lower re-distribution layer has an opening therein, which at least partially exposes the lower surface of the inner semiconductor chip;
wherein the lower semiconductor chip extends within the opening;
wherein the lower re-distribution layer comprises:
a first insulating layer covering the lower surface of the frame;
a re-distribution pattern disposed on the first insulating layer;
a barrier layer disposed on the first insulating layer, and
a second insulating layer disposed on the barrier layer;
wherein the lower semiconductor chip comprises:
a body disposed on the lower surface of the inner semiconductor chip;
a solder ball electrically connecting the body and the inner semiconductor chip, and
a mold layer interposed between the body and the lower re-distribution layer;
wherein the barrier layer surrounds the lower semiconductor chip when viewed in a top view; and
wherein a portion of an upper surface of the barrier layer contacts the mold layer.

19. The packaged device of claim 18, wherein a maximum horizontal distance between a side surface of the body and an inner side surface of the barrier layer is smaller than a minimum horizontal distance between the side surface of the body and an inner side surface of the second insulating layer when viewed from a top plan view perspective.

20. The packaged device of claim 18, wherein the first insulating layer comprises a photo imageable dielectric (PID); and wherein the barrier layer comprises copper.

* * * * *